United States Patent [19]
Yoshida

[11] Patent Number: 6,091,281
[45] Date of Patent: Jul. 18, 2000

[54] HIGH PRECISION REFERENCE VOLTAGE GENERATOR

[75] Inventor: Haruo Yoshida, Gyoda, Japan

[73] Assignee: Advantest Corp., Tokyo, Japan

[21] Appl. No.: 09/035,406

[22] Filed: Mar. 5, 1998

[30] Foreign Application Priority Data

Mar. 19, 1997 [JP] Japan ................................. 9-066560

[51] Int. Cl.[7] .................................................. H01J 19/82
[52] U.S. Cl. ........................ 327/532; 327/156; 327/102
[58] Field of Search ................................... 327/147, 156, 327/162, 163, 102, 100, 532; 331/17, 25, DIG. 2

[56] References Cited

U.S. PATENT DOCUMENTS

| | | | |
|---|---|---|---|
| 5,038,115 | 8/1991 | Myers et al. ................................. | 331/2 |
| 5,075,639 | 12/1991 | Taya ............................................. | 331/2 |
| 5,479,136 | 12/1995 | Endo et al. ................................. | 331/2 |
| 5,646,562 | 7/1997 | Abe ............................................. | 331/17 |
| 5,905,759 | 5/1999 | Ishida et al. ............................. | 375/282 |

*Primary Examiner*—Jung Ho Kim
*Attorney, Agent, or Firm*—Muramatsu & Associates

[57] ABSTRACT

A reference voltage generator includes a voltage controlled oscillator which has fixed and accurate relationship between a frequency of an oscillation signal and a voltage supplied thereto, a reference frequency oscillator for generating a reference frequency signal of high accuracy and stability, a phase comparator for detecting a phase difference between the oscillation signal of the voltage controlled oscillator and the reference frequency signal, a low pass filter for smoothing a detection signal from the phase comparator, a gain adjust circuit for amplifying a signal from the low pass filter, a voltage adder for providing a sum of voltages from the gain adjust circuit and an offset voltage to the voltage controlled oscillator, and a phase clock loop formed by the phase comparator, low pass filter, gain adjust circuit and voltage adder to null the phase difference by regulating a control voltage applied to the voltage controlled oscillator.

12 Claims, 7 Drawing Sheets

HIGH PRECISION REFERENCE VOLTAGE GENERATOR

FIELD OF THE INVENTION

This invention relates to a reference voltage generator, and more particularly, to a high precision reference voltage generator to be installed in test instruments, voltage generators or general purpose apparatuses for generating a high precision DC voltage.

BACKGROUND OF THE INVENTION

For generating a high precision voltage reference, there are mainly three types of technologies conventionally used. The first type of technology utilizes a standard battery such as a Weston standard cell. Until recently, the standard battery has been used as a national voltage standard. The standard battery generates a DC voltage of 1.018636V at 20° C. However, because the output voltage level is sensitive to temperature or mechanical vibration, the standard battery must be installed in a vibration free environment with a precise temperature control and management.

The second type of technology is a reference voltage generator using a zener diode (constant voltage diode). This technology is most widely used in voltage measurement instruments, voltage generators and the like. However, since zener diodes utilize an avalanche effect in the PN junction of the diodes, the resultant voltages involve relatively large short term variations. Zener diodes also involve long term voltage variations such as in the order of a few ppm (parts per million). Thus, zener diodes are sometimes not an ideal voltage reference when a higher level of voltage precision is required.

The third type of technology is a Josephson voltage standard utilizing a Josephson effect. In a Josephson junction, there is precise relationship between DC output voltages and frequencies of a microwave signal applied thereto. It is known in the art that frequency has a higher degree of accuracy than other units such as voltage, resistance, or the like. Thus, precision DC voltages corresponding to frequencies (F/V conversion) can be obtained by applying a high accuracy frequency to the Josephson junction. The resultant DC voltage has accuracy which is comparable to that of the frequency. However, the Josephson voltage standard is not ideal for general purpose apparatuses because this voltage standard apparatus is large and expensive due to the need of an array of super conductive Josephson junctions, liquid helium to cool the junction array, and a relatively large mechanical structure since it involves a millimeter wave technology.

As explained above, the conventional reference voltage generators have disadvantages in applying to small sized apparatuses such as test instruments. Thus, there exists practical difficulties in such instruments to have a reference voltage generator for generating high precision DC voltages such as in the order of 0.1 ppm.

SUMMARY OF THE INVENTION

Therefore, it is an object of the present invention to provide a reference voltage generator which is capable of generating high precision reference voltages and suitable for use in small sized test such as digital voltmeters, voltage generators or other general purpose devices.

It is another object of the present invention to provide a reference voltage generator which is capable of generating high precision reference voltage without requiring any special facilities such as a temperature controlled room or a vibration free room.

It is a further object of the present invention to provide a reference voltage generator which is capable of generating high precision reference voltages with a circuit configuration of small size and low cost.

The high precision reference voltage generator is able to generate a reference DC voltage by utilizing the fixed and accurate relationship between a control voltage supplied to a voltage controlled oscillator and an oscillation frequency of the voltage controlled oscillator. The voltage controlled oscillator is included in a phase lock loop to match the phase of the oscillation frequency with the phase of a reference frequency.

The first embodiment of the reference voltage generator includes a voltage controlled oscillator which has fixed and accurate relationship between a frequency of an oscillation signal and a voltage supplied thereto, a reference frequency oscillator for generating a reference frequency signal of high accuracy and stability greater than that of the reference DC voltage to be generated, a phase comparator for detecting a phase difference between the oscillation signal of the voltage controlled oscillator and the reference frequency signal, a low pass filter for smoothing a detection signal from the phase comparator showing the phase difference, a gain adjust circuit for amplifying a signal from the low pass filter, a voltage adder for providing a sum of voltages from the gain adjust circuit and an offset voltage to the voltage controlled oscillator, and a phase clock loop formed by the phase comparator, the low pass filter, the gain adjust circuit and the voltage adder to null the phase difference by regulating a control voltage applied to the voltage controlled oscillator, wherein the control voltage is output as the reference DC voltage.

Preferably, the voltage controlled oscillator is a voltage controlled temperature compensated crystal oscillator (TCXO). The example of the reference frequency oscillator is an atomic standard oscillator. Another example of the reference frequency oscillator produces the reference frequency signal based on a frequency standard signal emitted by an artificial satellite provided in Global Positioning System (GPS).

In a further aspect of the present invention, the reference voltage generator further includes a frequency divider between the voltage controlled oscillator and the phase comparator for dividing the frequency of the oscillation signal from the voltage controlled oscillator and supplying a divided frequency signal to the phase comparator. The reference voltage generator may further include a low pass filter between the voltage adder and the voltage controlled oscillator and a low pass filter between the output of the voltage adder and an output terminal of the reference DC voltage.

The second embodiment of the reference voltage generator includes a voltage controlled temperature compensated crystal oscillator (TCXO) having fixed and accurate relationship between a frequency of an oscillation signal and a voltage supplied thereto, a reference frequency oscillator for generating a reference frequency signal of high accuracy and stability greater than that of the reference DC voltage to be generated, a frequency synthesizer for receiving the reference frequency signal and generating a standard signal having the same frequency stability of the reference frequency signal wherein the frequency of the standard signal is set by frequency data provided thereto, a phase comparator for detecting a phase difference between the oscillation signal of the voltage controlled TCXO and the standard signal from the frequency synthesizer, a low pass filter for smoothing a detection signal from the phase comparator showing the phase difference, a gain adjust circuit for amplifying a signal from the low pass filter, a voltage adder for providing a sum of voltages from the gain adjust circuit and an offset voltage to the voltage controlled TCXO, a digital-to-analog (DA) converter for producing the offset voltage supplied to the voltage adder, a controller for providing offset voltage data to the DA converter and the frequency data to the frequency synthesizer, wherein a phase clock loop is formed by the phase comparator, the low pass filter, the gain adjust circuit and the voltage adder to minimize the phase difference by regulating a control voltage applied to the voltage controlled TCXO, and the control voltage is output as the reference DC voltage.

In a further aspect of the second embodiment, the reference voltage generator further includes a linearity correction table for storing correction data for compensating nonlinearity in the relationship between the frequency of the TCXO and the voltage supplied to the TCXO, wherein the controller modifying the frequency data to the frequency synthesizer based on the correction data read out from the linearity correction table.

In a further aspect of the present invention, the reference voltage generator includes a voltage controlled oscillator which has fixed and accurate relationship between a frequency of an oscillation signal and a voltage supplied thereto, a reference frequency oscillator for generating a reference frequency signal of high accuracy and stability greater than that of the reference DC voltage to be generated, a phase comparator for detecting a phase difference between the oscillation signal of the voltage controlled oscillator and the reference frequency signal, a low pass filter for smoothing a detection signal from the phase comparator showing the phase difference, a gain adjust circuit for amplifying a signal from the low pass filter, and a phase clock loop formed by the phase comparator, the low pass filter, and the gain adjust circuit to minimize the phase difference by regulating a control voltage applied to the voltage controlled oscillator, wherein the control voltage is output as the reference DC voltage.

According to the present invention, the reference voltage generator is capable of generating high precision reference voltages comparable to the precision of frequency of the crystal oscillator and suitable for use in small sized test instruments such as digital voltmeters, voltage generators or other general purpose devices. The reference voltage generator which can generate the high precision reference voltage without requiring any special facilities such as a temperature controlled room or a vibration free room. The reference voltage generator of the present invention can be configured with small size and low cost while achieving voltage accuracy in the order of 0.1 ppm.

DETAILED DESCRIPTION OF THE PREFERRED EMBODIMENT

Figure 1:
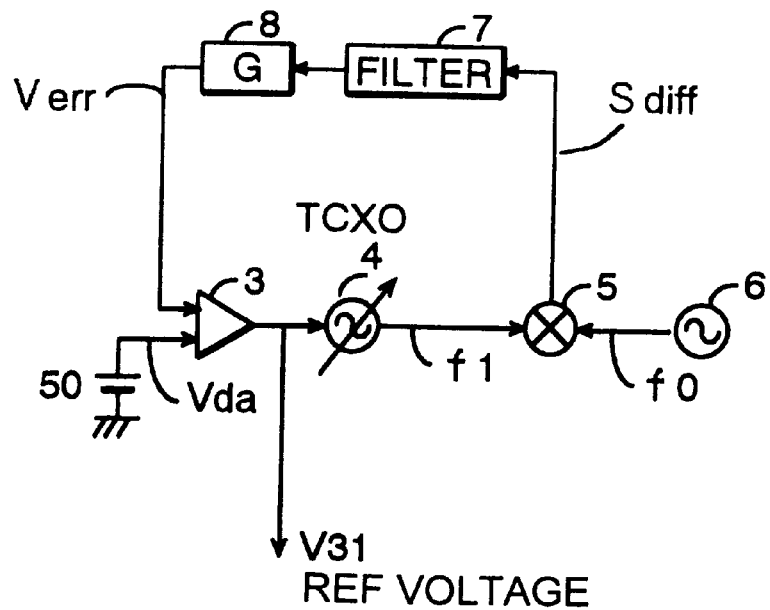
FIG. 1 is a schematic diagram showing a configuration of a first embodiment of a high precision reference voltage generator of the present invention.
Figure 3A:
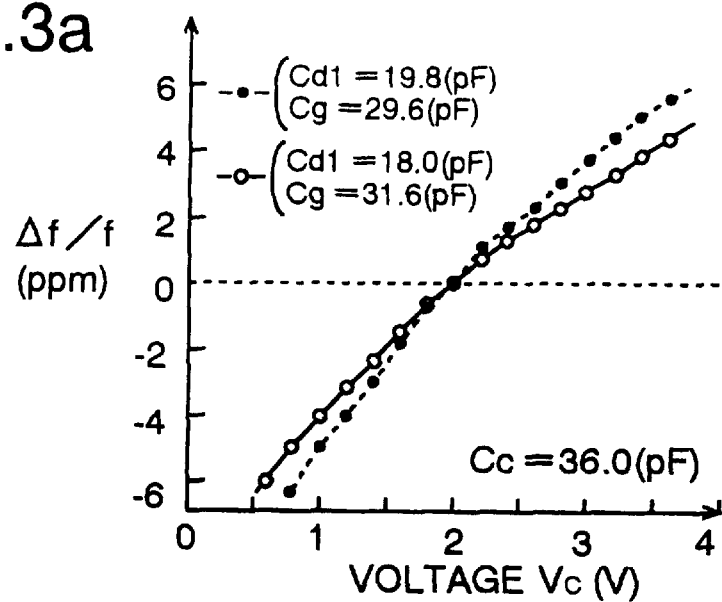
FIGS. 3a–3c are graphs showing characteristics of a voltage controlled temperature controlled crystal oscillator (TCXO) to be used in the present invention.
Figure 3B:
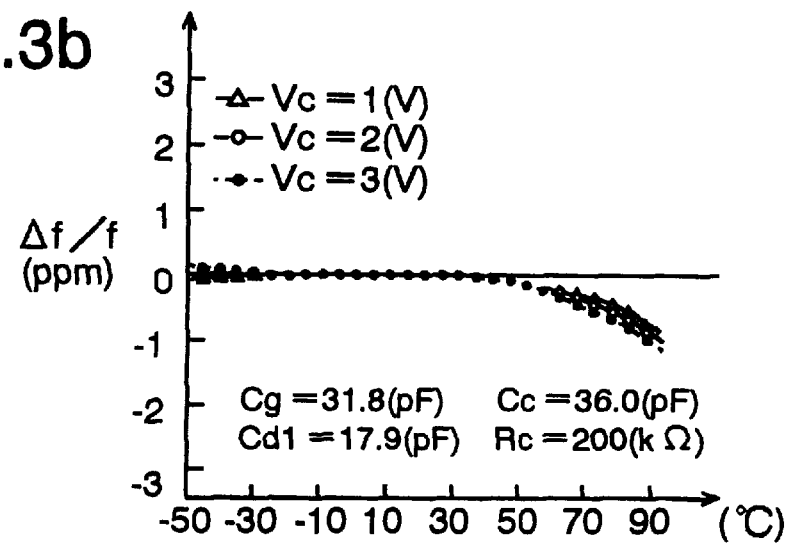
Figure 3C:
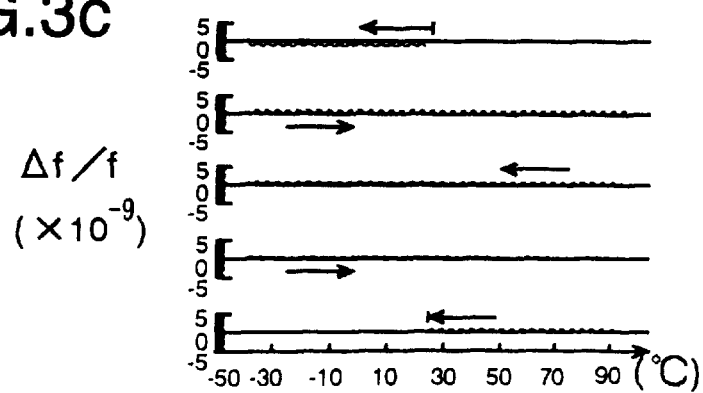
Figure 4A:
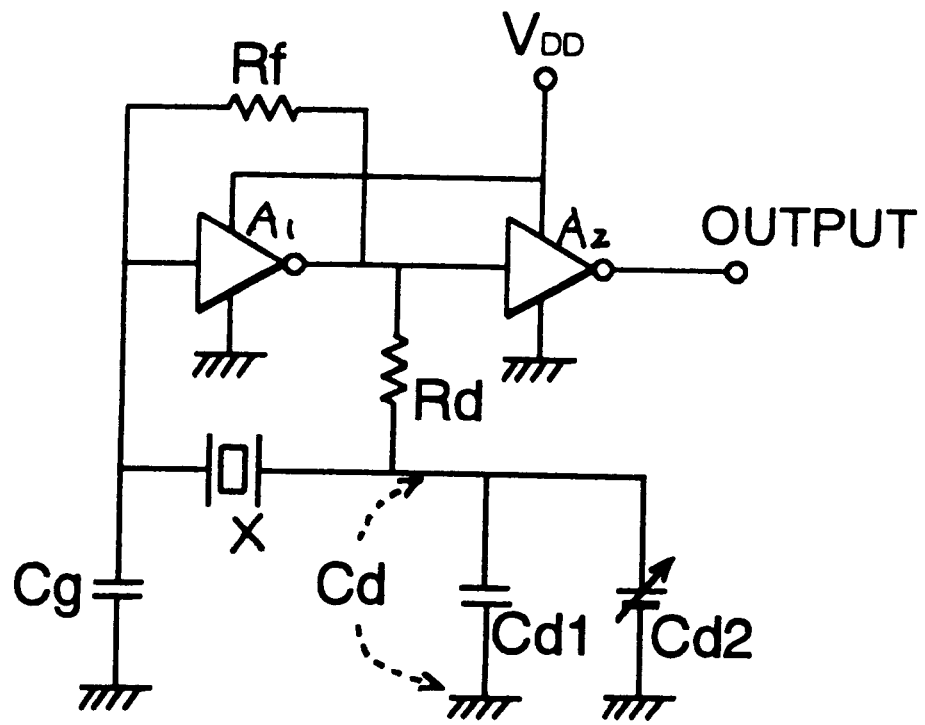
FIGS. 4a and 4b are circuit diagram showing an example of structure of a voltage controlled TCXO to be used in the present invention.
Figure 4B:
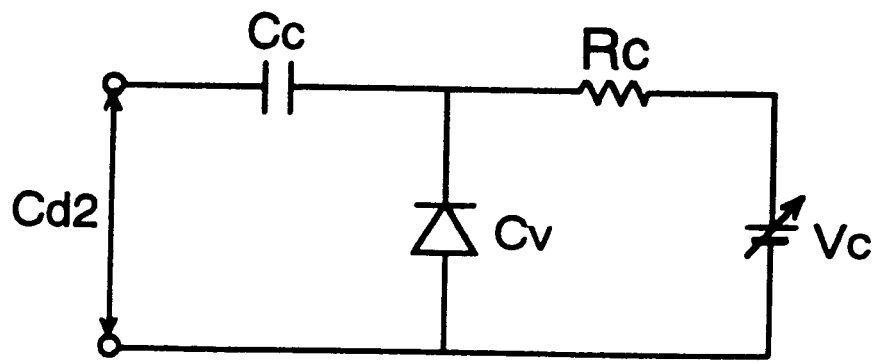
Figure 7:
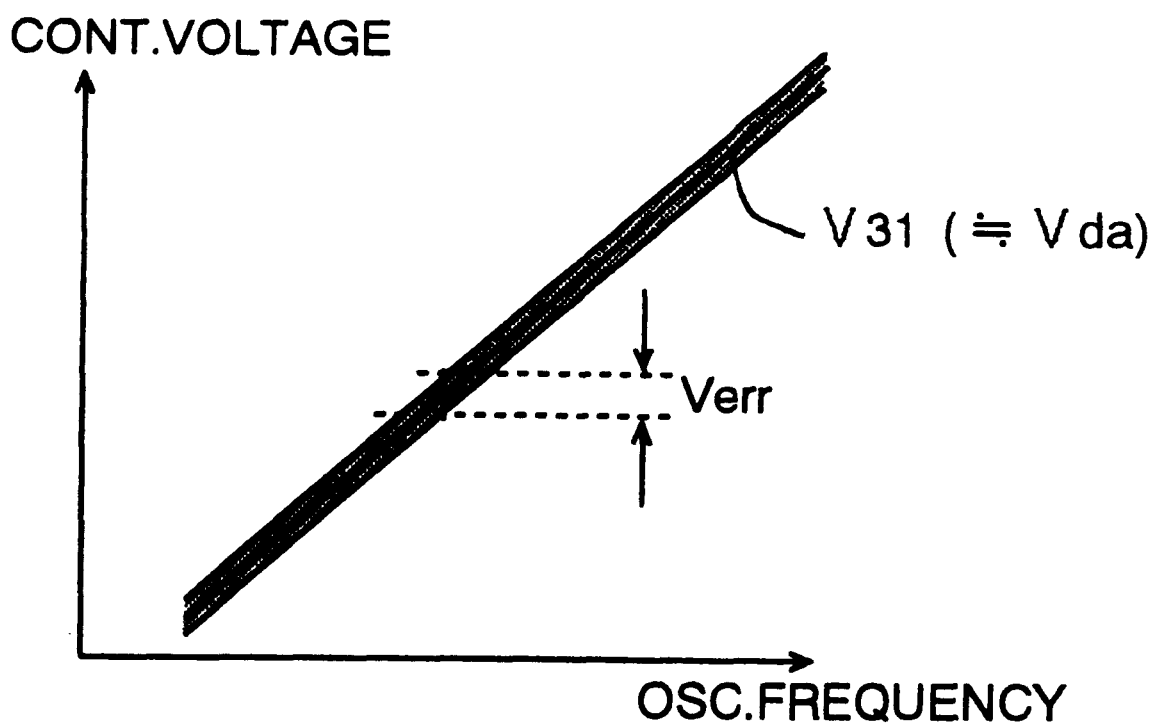
FIG. 7 is a graph showing relationship between the oscillation frequency and the output voltage of the high precision reference voltage generator of the present invention.

In the present invention, the high precision reference voltage generator is achieved based on a frequency to voltage (F/V) conversion technique. The first embodiment of the present invention is explained with reference to FIG. 1. FIG. 1 is a schematic diagram showing a configuration of the high precision reference voltage generator. FIGS. 3a–3c show characteristics of a voltage controlled temperature compensated crystal oscillator (TCXO) to be used in the voltage generator of FIG. 1 and FIGS. 4a and 4b show an example of structure of the voltage controlled TCXO. FIG. 7 is a graph showing relationship between the oscillation frequency of the voltage controlled TCXO and the output voltage of the reference voltage generator.

In the example of FIG. 1, the reference voltage generator of the present invention is formed with a voltage controlled oscillator (VCO) 4 which has fixed and accurate relationship between an oscillation frequency and a given voltage, a reference frequency oscillator 6 for generating a reference frequency signal of high accuracy and stability, a phase comparator 5 for detecting a phase difference between the signal of the voltage controlled oscillator 4 and the reference frequency oscillator 6, a low pass filter 7 for smoothing a detection signal $S_{diff}$ from the phase comparator 5, a gain adjust circuit 8 for amplifying a signal level from the low pass filter 7 and a voltage adder 3 for providing a sum of voltages from the gain adjust circuit 8 and an offset voltage to the voltage controlled oscillator 4.

An example of the voltage controlled oscillator 4 in this invention is a voltage controlled TCXO (temperature compensated crystal oscillator) which will be further explained with reference to FIGS. 3 and 4. The voltage controlled TCXO shows voltage/frequency relationship of very high accuracy even in an environment of wide temperature range. For example, the frequency stability of a TCXO is in the order of $10^{-9}$.

Examples of characteristics of voltage controlled TCXO are shown in FIGS. 3a–3c which are obtained by the circuit configuration of FIGS. 4a and 4b. More details of the voltage controlled TCXO are shown in "Voltage controlled S-TCXOs Using NS-GT Cut Quartz Crystal Resonators"

Kawashima et al., Institute of Electronics Information and Communication, Transaction C-I, Vol. J78-C-I, No. 11, pp.533–540.

In the circuit diagram of FIG. 4a, the voltage controlled TCXO is formed by installing a crystal resonator X in an oscillation circuit having an amplifier $A_1$ and various capacitors including a variable capacitor. The amplifier $A_1$ is a low noise FET (field effect transistor) and capacitors $C_g$ and $C_d$ designate a gate capacitor and a drain capacitor of the FET, respectively. An amplifier $A_2$ functions as a buffer. The drain capacitor $C_d$ includes a stray drain capacitor $C_{d1}$, and a variable capacitor $C_{d2}$. The variable capacitor $C_{d2}$ is provided to control the oscillation frequency of the TCXO. An example of the variable capacitor $C_{d2}$ is a variable capacitance diode whose equivalent circuit is shown in FIG. 4b. By the change in a control voltage $V_c$ supplied to the variable capacitor $C_{d2}$ in FIG. 4b, the capacitor $C_{d2}$ is changed, which controls the oscillation frequency of the voltage controlled TCXO of FIG. 4a.

FIG. 3a shows relationship between the control voltage $V_c$ to the variable capacitor $C_{d2}$ of FIG. 4b and the oscillation frequency of the TCXO for parameters of the gate and drain capacitors $C_g$ and $C_{d1}$. FIG. 3b shows the characteristics of frequency versus temperature for parameters of the control voltage $V_c$. FIG. 3c shows results of a temperature cycle test wherein a temperature cycle of +25° C., –40° C., +90° C., +25° C. is repeated two times as shown by arrows in the graph. The frequency deviation $\Delta f/f$ during the temperature cycle is traced. As shown in FIG. 3c, the TCXO using NS-GT cut crystal resonator shows a high frequency stability wherein the frequency deviation for the temperature between –30° C. and +85° C. is within in $3 \times 10^{-9}$. It is apparent that even higher frequency stability will be available when the temperature change around the TCXO is limited within a small range by regulating the temperature by for example a temperature oven.

Therefore, in the present invention, because of the fixed relationship between the voltage supplied to the TCXO and the oscillation frequency, the supplied voltage can be used as a high precision reference voltage source. Thus, in the example of FIG. 1, a voltage $V_{31}$ received from the output of the voltage adder 3 is the high precision reference DC voltage of the present invention.

In the configuration of FIG. 1, a phase lock loop (PLL) is formed to feedback the detection signal $S_{diff}$ showing the phase difference between two frequency signals so as to control the frequency of the voltage controlled TCXO 4 to be equal to the reference signal frequency. More particularly, the PLL is formed by the negative feedback loop formed by the TCXO 4, the phase comparator 5, the reference frequency oscillator 6, the low pass filter 7, the gain adjust circuit 8, and the voltage adder 3.

The reference frequency oscillator 6 needs to have frequency precision (stability) higher than the precision required for the reference voltage $V_{31}$. Preferably, the frequency stability of the reference frequency oscillator 6 should be in the order of $10^{-11}$ or $10^{-12}$, which is relatively easily available in the market. An example of the reference frequency oscillator 6 is an atomic frequency standard generator based on atomic resonance of cesium atom or rubidium atom. Another example of the reference frequency oscillator 6 is a frequency generator disclosed in Japanese Patent Laid Open Publication No. 8-146166 which generates high precision frequency signals based on a standard frequency received from an artificial satellite incorporated in Global Positioning System (GPS).

The phase comparator 5 compares phases of the oscillation frequency $f_1$, of the TCXO 4 and the oscillation frequency $f_0$ of the reference frequency oscillator 6. The phase comparator 5 generates a signal $S_{diff}$ representing the phase difference between the two frequency signals.

The low pass filter 7 is to define a loop response characteristics of the PLL and to stabilize an operation of the PLL for locking-in the loop. The low pass filter 7 receives the detection signal $S_{diff}$ from the phase comparator 5 and converts the detection signal to a DC signal to be applied to the gain adjust circuit 8.

The gain adjust circuit 8 receives the DC signal from the low pass filter 7 and amplifying the DC signal by a predetermined gain to provide an error voltage $V_{err}$ to one terminal of the voltage adder 3 whose another terminal is provided with an offset voltage $V_{da}$. The voltage adder 3 adds the error voltage $V_{err}$ and the offset voltage $V_{da}$ from a voltage source 50 to produce the control voltage supplied to the TCXO 4.

As is known in the art, by adjusting the parameters of the low pass filter 7 and the gain adjust circuit 8, a loop response curve of the PLL is selected to perform a high stability operation. The offset voltage $V_{da}$ is preferably selected such that the output voltage of the voltage adder 3 without error voltage $V_{err}$ is substantially the same as the control voltage (reference voltage). In this situation, the voltage range of the error voltage $V_{err}$ can be very small as shown in FIG. 7. The voltage source 50 should be formed of devices with high S/N ratio (low noise) so that the offset voltage $V_{da}$ includes as less noise as possible. The voltage adder 3 should also be formed of devices with high S/N ration so that no noise will be added to the output voltage $V_{31}$. The voltage adder 3 can be an operational amplifier or a differential amplifier.

When the phase lock loop is in the lock-in condition, a feedback voltage at the output of the voltage adder 3 for controlling the TCXO 4 has a high stability and precision because of the frequency versus voltage relationship shown in FIG. 3a. Thus, an output voltage $V_{31}$ derived from the feedback control voltage is a high precision reference voltage generated by the reference voltage generator of the present invention.

Figure 6:
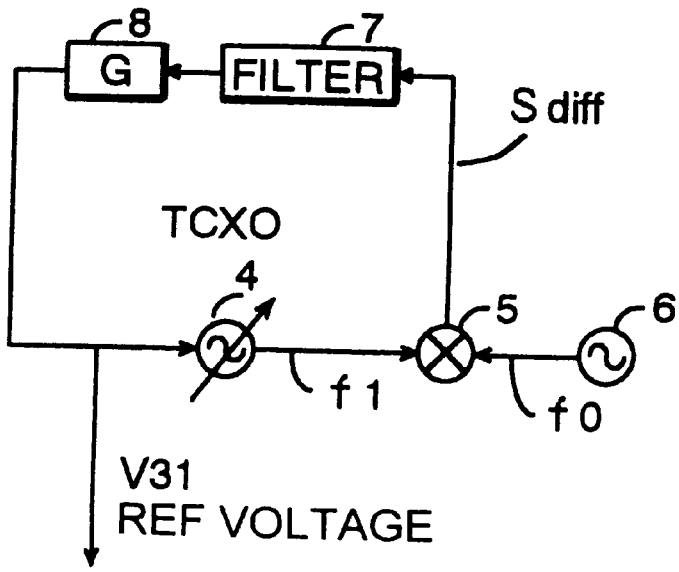
FIG. 6 is a schematic diagram showing another example of modified version of the high precision voltage generator of the present invention.

The example of FIG. 1 includes the voltage source 50 and the voltage adder 3 for adjusting the center voltage to be supplied to the TCXO 4. If a voltage dynamic range of the PLL is large enough, the voltage source 50 and the voltage adder 3 are unnecessary. Such an example is shown in FIG. 6 wherein the error voltage $V_{err}$ from the gain adjust circuit 8 is directly provided to the TCXO 4. Thus, the error voltage $V_{err}$ is the reference voltage to be generated by the reference voltage generator of the present invention.

Figure 11:
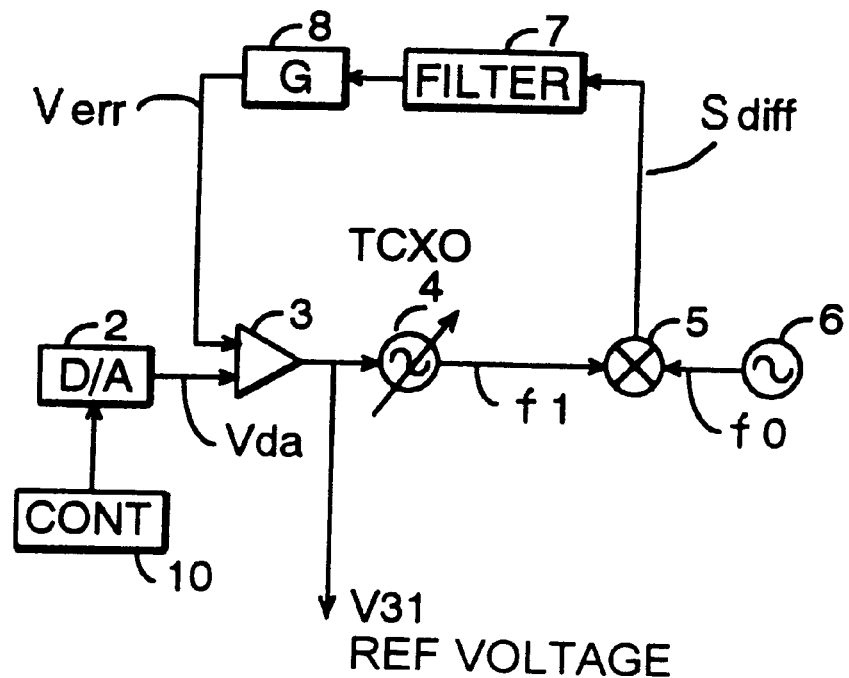
FIG. 11 is a schematic diagram showing a further example of modified version of the high precision reference voltage generator of the present invention.

FIG. 11 shows an example where the voltage source 50 in FIG. 1 is replaced with a DA (digital-to-analog) converter 2. A controller 10 is provided to set the data in the DA converter 2 to generate an offset voltage $V_{da}$ to produce a center voltage suitable to generate a frequency close to $f_1$ by the TCXO 4 when the PLL is not in the lock-in condition. Thus, when the PLL is lock-in, the error voltage $V_{err}$ to the voltage adder 3 will be very small such as in the range shown in FIG. 7.

Figure 10:
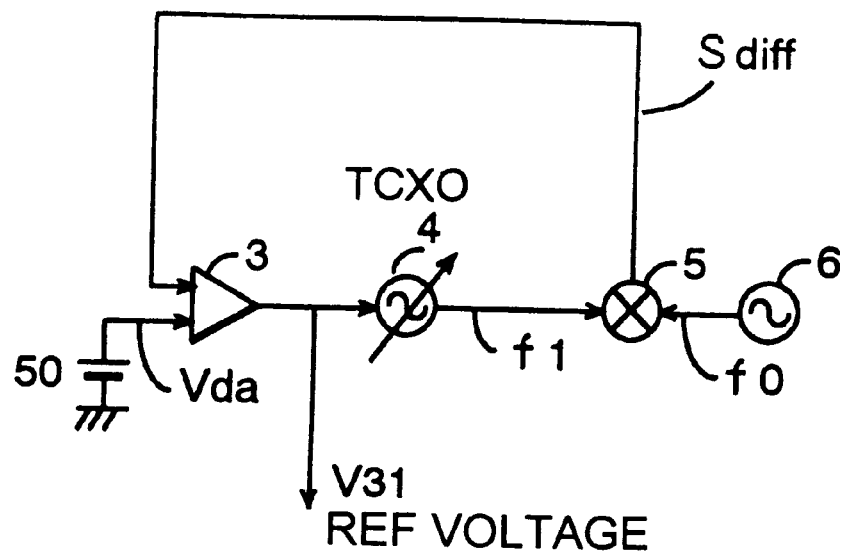
FIG. 10 is a schematic diagram showing a further example of modified version of the high precision reference voltage generator of the present invention.

FIG. 10 shows an example where the low pass filter 7 and the gain adjust circuit 8 are removed from the PLL. Thus, in this case, the phase difference signal $S_{diff}$ is the reference voltage to be generated by the reference voltage generator of the present invention.

Therefore, in the present invention, because of the fixed relationship between the control voltage supplied to the TCXO and the oscillation frequency of the TCXO, the control voltage shows a high precision DC voltage. Thus, the reference voltage $V_{31}$ taken out from the control voltage has high precision and stability comparable to that of the oscillation frequency of the TCXO 4. When the PLL is locked, variations of parameters caused by temperature or other changes in the components of the PLL such as the low pass filter 7, the gain adjust circuit 8, the voltage source 50, and the voltage adder 3, will not adversely affect the precision and stability of the reference voltage $V_{31}$.

Figure 2:
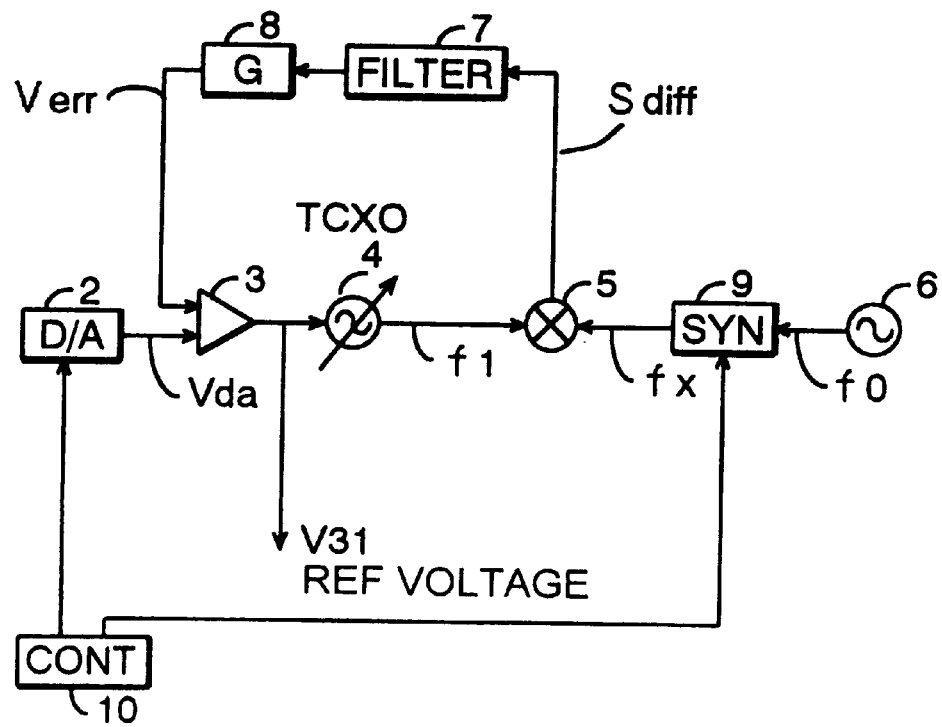
FIG. 2 is a schematic diagram showing a configuration of a second embodiment of a high precision reference voltage generator of the present invention.

FIG. 2 is a schematic diagram showing a configuration of a second embodiment of the high precision reference voltage generator of the present invention. In this example, because of the fixed and accurate relationship between the control voltage supplied to the TCXO and the oscillation frequency of the TCXO and a frequency synthesizer which can freely set the reference frequency, arbitrary values of reference voltage $V_{31}$ are generated by regulating the reference frequencies by the frequency synthesizer 9.

In the example of FIG. 2, the reference voltage generator of the present invention is formed with a voltage controlled TCXO 4 having the fixed and highly stabilized relationship between its oscillation frequency and the voltage supplied thereto, a reference frequency oscillator 6 for generating a reference frequency signal of high accuracy and stability, a frequency synthesizer 9 for generating a reference signal of arbitrary frequency with the accuracy and stability of the reference frequency signal from the reference oscillator 6, a phase comparator 5 for detecting a phase difference between the oscillation signal of the TCXO 4 and the reference signal from the frequency synthesizer 9, a low pass filter 7 for smoothing a detection signal $S_{diff}$ from the phase comparator 5, a gain adjust circuit 8 for amplifying a signal level from the low pass filter 7, a voltage adder 3 for providing a sum of voltages from the gain adjust circuit 8 and an offset voltage produced by a D/A converter 2 to the TCXO 4, and a controller 10 for controlling the operation of the frequency synthesizer 9 and the D/A converter 2.

Based on the control signal from the controller 10, the frequency synthesizer 9 generates a reference signal $f_x$ of arbitrary frequency. The reference signal has the same or equivalent frequency accuracy and stability of the reference frequency from the reference oscillator 6. Thus, by regulating frequency of the reference signal $f_x$ to the phase comparator 5, the resultant reference voltage $V_{31}$ is varied its voltage values accordingly.

Figure 8:
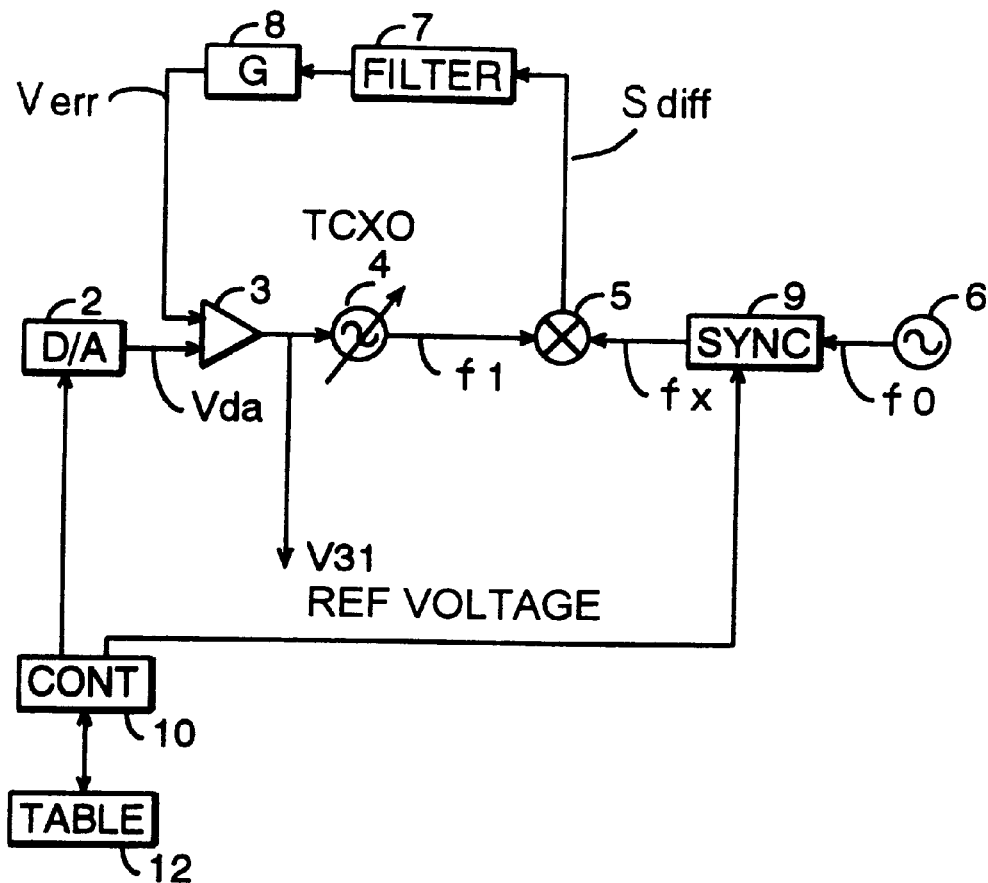
FIG. 8 is a schematic diagram showing a further example of modified version of the high precision reference voltage generator of the present invention.

An example of FIG. 8 further includes a linearity correction table 12 connected to the controller 10. As shown in FIG. 3a, the voltage/frequency characteristics between the control voltage and the frequencies generated by the TCXO shows certain degrees of nonlinearity. The linearity correction table 12 stores data obtained by measuring the nonlinearity of the TCXO for compensating the nonlinearity. The controller 10 sets the frequency data for the frequency synthesizer which is corrected by the data stored in the linearity correction table. Thus, by regulating frequency of the reference signal $f_x$ to the phase comparator 5, the resultant reference voltage $V_{31}$ is varied its voltage value with improved voltage/frequency linearity.

In case where the capacity of the linearity correction table is limited, the controller 10 may perform an interpolation process where correction data between two adjacent data points will be produced by a linear or nonlinear interpolation technique known in the art. In such an arrangement, the memory capacity of the linearity correction table 12 will be substantially reduced.

Figure 5:
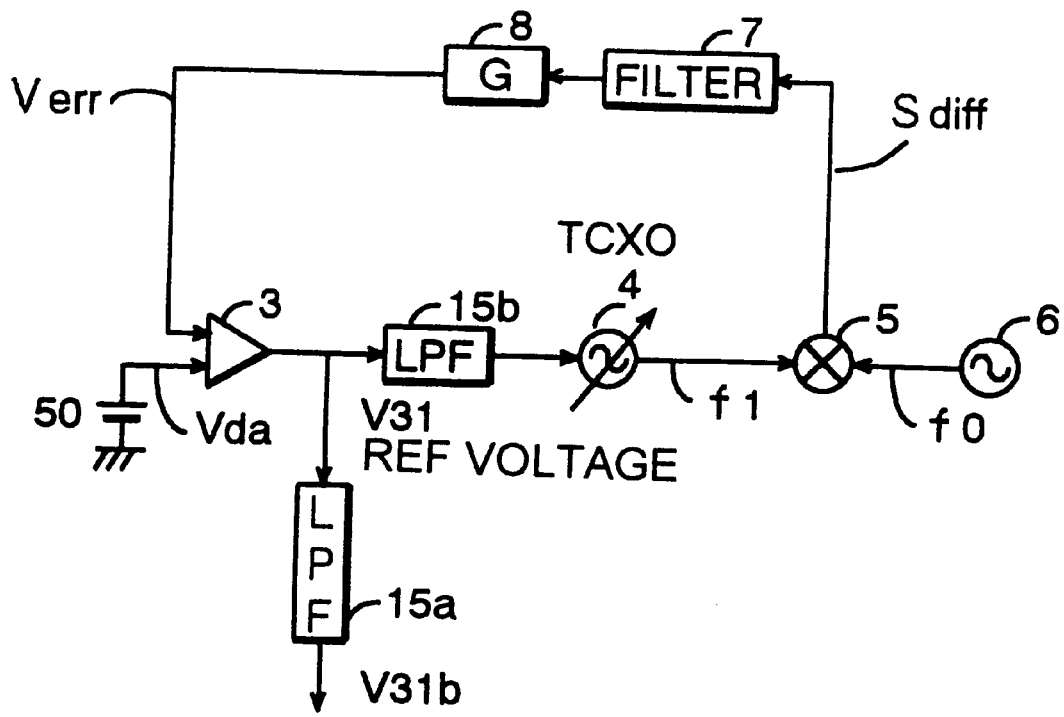
FIG. 5 is a schematic diagram showing an example of modified version of the high precision voltage generator of the present invention.

An example of FIG. 5 includes a low pass filter 15a at the output of the reference voltage $V_{31}$ and a low pass filter 15b in the PLL between the voltage adder 3 and the TCXO 4. The purpose of the low pass filters 15a and 15b is to reduce noise involved when power supply sources or other signals connected to the PLL are fluctuated or when signal paths are long and susceptible to surrounding noise. The other purpose of the low pass filter is to reduce ripples and noise voltages superimposed on the reference voltage $V_{31}$. It is apparent that the low pass filter 15a must not cause a voltage drop in the reference voltage $V_{31}$.

Figure 9:
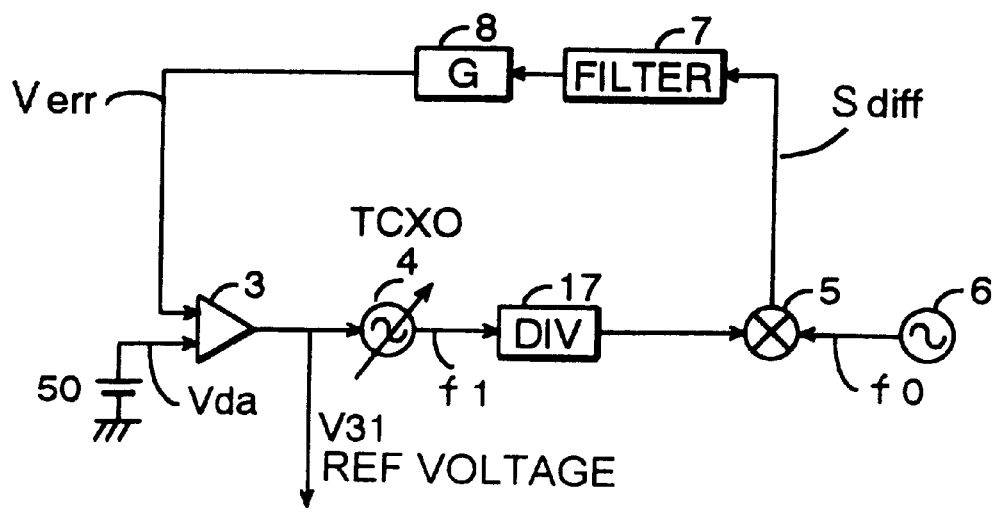
FIG. 9 is a schematic diagram showing a further example of modified version of the high precision reference voltage generator of the present invention.

An example of FIG. 9 includes a frequency divider 17 between the TCXO 4 and the phase comparator 5. In this arrangement, the oscillation frequency $f_1$ of the TCXO 4 can be, for example, an integer multiple of the reference frequency $f_0$ of the reference oscillator 6. Such a frequency divider can be formed of a logic divider which simply divides the frequency of an incoming signal or a direct digital synthesizer (DDS) which produce arbitrary frequencies based on the incoming signal. In case where the reference frequency $f_0$ is substantially higher than the oscillation frequency $f_1$, a frequency divider may be inserted between the reference frequency oscillator 6 and the phase comparator 5.

In the foregoing embodiments, TCXO having a crystal resonator therein is used as a voltage controlled oscillator. However, the voltage controlled oscillator in the present invention is not limited to crystal oscillators but other types of voltage control oscillator can also be used so long as there is fixed and stable relationship between the voltage supplied thereto and the frequency generated therefrom.

As described in the foregoing, in the present invention, because of the fixed relationship between the control voltage supplied to the TCXO and the oscillation frequency of the TCXO, the control voltage shows a high precision DC voltage. Thus, the reference voltage $V_{31}$ taken out from the control voltage has high precision and stability comparable to that of the frequency of the TCXO 4. When the PLL is locked, variations of parameters caused by temperature or other changes in the components of the PLL such as the low pass filter 7, the gain adjust circuit 8, the voltage source 50, and the voltage adder 3, will not adversely affect the precision and stability of the reference voltage $V_{31}$.

In the second embodiment using the frequency synthesizer, based on the control signal from the controller 10, the frequency synthesizer 9 generates a reference signal $f_x$ of arbitrary frequency. The reference signal has the same or equivalent frequency accuracy and stability of the reference frequency from the reference oscillator 6. Thus, by regulating frequency of the reference signal $f_x$ to the phase comparator 5, the resultant reference voltage $V_{31}$ is varied its voltage values accordingly.

According to the present invention, the reference voltage generator is capable of generating high precision reference voltages comparable to the precision of frequency of the crystal oscillator and suitable for use in small sized test instruments such as digital voltmeters, voltage generators or other general purpose devices. The reference voltage generator which can generate the high precision reference voltage without requiring any special facilities such as a temperature controlled room or a vibration free room. The reference voltage generator of the present invention can be configured with small size and low cost.

What is claimed is:

1. A high precision voltage generator for generating a reference DC voltage, comprising:

a voltage controlled oscillator which has fixed and accurate relationship between a frequency of an oscillation signal and a voltage supplied thereto;

a reference frequency oscillator for generating a reference frequency signal of high accuracy and stability greater than that of the reference DC voltage to be generated;

a phase comparator for detecting a phase difference between the oscillation signal of the voltage controlled oscillator and the reference frequency signal;

a low pass filter for smoothing a detection signal from the phase comparator showing said phase difference;

a gain adjust circuit for amplifying a signal from the low pass filter; and a voltage adder for providing a sum of voltages from the gain adjust circuit and an offset voltage to the voltage controlled oscillator;

wherein a phase clock loop is formed by said phase comparator, said low pass filter, said gain adjust circuit and said voltage adder to null said phase difference by regulating a control voltage applied to said voltage controlled oscillator, and said control voltage is output as said reference DC voltage.

2. A high precision voltage generator as defined in claim 1, wherein said voltage controlled oscillator is a voltage controlled temperature compensated crystal oscillator (TCXO).

3. A high precision voltage generator as defined in claim 1, further comprising a frequency divider between said voltage controlled oscillator and said phase comparator for dividing said frequency of said oscillation signal from said voltage controlled oscillator and supplying a divided frequency signal to said phase comparator.

4. A high precision voltage generator as defined in claim 1, further comprising a second low pass filter between said voltage adder and said voltage controlled oscillator and a third low pass filter between the output of said voltage adder and an output terminal of said reference DC voltage.

5. A high precision voltage generator as defined in claim 1, wherein said reference frequency oscillator includes an atomic standard oscillator.

6. A high precision voltage generator as defined in claim 1, wherein said reference frequency oscillator produces said reference frequency signal based on a frequency standard signal emitted by an artificial satellite provided in Global Positioning System (GPS).

7. A high precision voltage generator for generating a reference DC voltage, comprising:

a voltage controlled temperature compensated crystal oscillator (TCXO) having fixed and accurate relationship between a frequency of an oscillation signal and a voltage supplied thereto;

a reference frequency oscillator for generating a reference frequency signal of high accuracy and stability greater than that of the reference DC voltage to be generated;

a frequency synthesizer for receiving said reference frequency signal and generating a standard signal having the same frequency stability of said reference frequency signal, a frequency of said standard signal is set by frequency data provided thereto;

a phase comparator for detecting a phase difference between the oscillation signal of the voltage controlled TCXO and the standard signal from said frequency synthesizer;

a low pass filter for smoothing a detection signal from the phase comparator showing said phase difference;

a gain adjust circuit for amplifying a signal from the low pass filter;

a voltage adder for providing a sum of voltages from the gain adjust circuit and an offset voltage to the voltage controlled TCXO;

a digital-to-analog (DA) converter for producing said offset voltage supplied to said voltage adder; and a controller for providing offset voltage data to said DA converter and said frequency data to said frequency synthesizer;

wherein a phase clock loop is formed by said phase comparator, said low pass filter, said gain adjust circuit and said voltage adder to minimize said phase difference by regulating a control voltage applied to said voltage controlled TCXO, and said control voltage is output as said reference DC voltage.

8. A high precision voltage generator as defined in claim 7, further comprising a linearity correction table for storing correction data for compensating nonlinearity in said relationship between said frequency of said TCXO and said voltage supplied to said TCXO, wherein said controller modifying said frequency data to said frequency synthesizer based on said correction data read out from said linearity correction table.

9. A high precision voltage generator as defined in claim 7, further comprising a frequency divider between said voltage controlled oscillator and said phase comparator for dividing said frequency of said oscillation signal from said voltage controlled oscillator and supplying a divided frequency signal to said phase comparator.

10. A high precision voltage generator as defined in claim 7, further comprising a second low pass filter between said voltage adder and said voltage controlled oscillator and a third low pass filter between the output of said voltage adder and an output terminal of said reference DC voltage.

11. A high precision voltage generator as defined in claim 7, wherein said reference frequency oscillator includes an atomic standard oscillator.

12. A high precision voltage generator as defined in claim 7, wherein said reference frequency oscillator produces said reference frequency signal based on a frequency standard signal emitted by an artificial satellite provided in Global Positioning System (GPS).

* * * * *